United States Patent
Foust et al.

(10) Patent No.: US 6,908,561 B1
(45) Date of Patent: Jun. 21, 2005

(54) POLYMIDE-TO-SUBSTRATE ADHESION PROMOTION IN HDI

(75) Inventors: Donald Franklin Foust, Glenville, NY (US); William Francis Nealon, Glenville, NY (US); Robert G. Davies, Jr., Pennsauken, NJ (US); Charles E. Crepeau, E. Norriton, PA (US)

(73) Assignee: Lockhead Martin Corporation, Bethesda, MD (US)

( * ) Notice: Subject to any disclaimer, the term of this patent is extended or adjusted under 35 U.S.C. 154(b) by 321 days.

(21) Appl. No.: 10/245,948

(22) Filed: Sep. 18, 2002

Related U.S. Application Data

(60) Provisional application No. 60/333,204, filed on Nov. 6, 2001.

(51) Int. Cl.[7] .................................................. B32B 9/04
(52) U.S. Cl. .............................. 216/13; 216/20; 216/33; 216/35; 216/100; 216/102; 216/105; 216/108; 216/109
(58) Field of Search ............................. 216/13, 17–21, 216/33–35, 100–109

(56) References Cited

U.S. PATENT DOCUMENTS

| | | | | |
|---|---|---|---|---|
| 4,783,695 A | | 11/1988 | Eichelberger et al. ........ 357/65 |
| 4,959,121 A | * | 9/1990 | Dumas et al. ................. 216/83 |
| 5,384,691 A | * | 1/1995 | Neugebauer et al. ........ 361/794 |
| 5,563,341 A | * | 10/1996 | Fenner et al. ............. 73/335.11 |
| 6,004,679 A | * | 12/1999 | Mitchell et al. ............ 428/446 |
| 6,541,378 B1 | * | 4/2003 | Foust et al. ................. 438/687 |
| 6,632,314 B1 | * | 10/2003 | Yu et al. ..................... 156/241 |

* cited by examiner

*Primary Examiner*—Anita Alanko
(74) *Attorney, Agent, or Firm*—Duane Morris LLP

(57) ABSTRACT

Methods for adhering polyimide dielectric materials to copper-, titanium-, aluminum-, or copper-and-titanium-containing portions of a substrate are described. The methods include the steps of applying adhesion promoter to a clean surface of the substrate, and curing the adhesion promoter. SPIE varnish is applied over the cured adhesion promoter, and is itself cured. A further layer of adhesion promoter is applied over the cured SPIE varnish, and is cured. The polyimide dielectric material is then laminated to the adhesion promoter. Cleaning of the copper-containing substrate portions is performed by etching with etchant including cupric chloride, cleaning of the titanium-containing substrate portions is performed with etchant including HF, and cleaning of copper- and titanium-containing portions is performed by HF etching followed by cupric chloride etching. Aluminum-containing portions of the substrate are not etched.

14 Claims, 14 Drawing Sheets

Adhesion of SPIE Laminated to Metals

| Metal | Adhesion (lb/in) | |
|---|---|---|
| | Post Lamination | Post 24 Hour Water Boil |
| Printed Wiring Board Cu | >8 | >8 |
| Cu/Cr | >8 | >8 |
| Cu/Te | >8 | >8 |
| CP1 Ti | >8 | >8 |
| CP2 Ti | >8 | >8 |
| Sputtered Ti | >8 | >8 |
| 304 Stainless Steel | >8 | >8 |
| Alumina-based Ceramic | >8 | >8 |

FIGURE 11a

Adhesion to Titanium

| Material | Adhesion Promoter | Age of Titanium Surface | Age of Adhesion Promoter (days) | Post 24 Hour Water Boil Adhesion (lb/in) |
|---|---|---|---|---|
| CP2Ti | None | >1 Month | – | 0 |
| CP2Ti | VM651 | >1 Month | 1 | Discolored Ti |
| CP2Ti | VM651 | >1 Month | 12 | Discolored Ti |
| CP2Ti | VM651 | Freshly Etched | 12 | Discolored Ti |
| Sputtered | VM651 | Freshly Sputtered | 1 | 0 |
| CP2Ti | T2902 | >1 Month | 5 | >8 |
| CP2Ti | T2902 | Freshly Etched | 15 | >8 |
| CP1Ti | T2902 | >1 Month | 5 | 2-3 |
| CP1Ti | T2902 | Freshly Etched | 15 | 0 |
| Sputtered | T2902 | Freshly Sputtered | 1 | 2 |
| CP2Ti | VM651/T2902 | >1 Month | 12 | 0 to >8 (Variable) |
| CP2Ti | VM651/T2902 | Freshly Etched | 2 | >8 |
| CP2Ti | VM651/T2902 | Freshly Etched | 15 | >8 |
| CP1Ti | VM651/T2902 | >1 Month | 12 | 0 |
| CP1Ti | VM651/T2902 | Freshly Etched | 15 | >8 |
| Sputtered | VM651/T2902 | >1 Month | 21 | >8 |

FIGURE 11b

Detailed Titanium/Copper Process

Acetone Wipe
Iso Propyl Alcohol (IPA) Wipe
Dry
1 min HF (5%), RT
2 min Water Rinse
2 min MicroEtch (14.8 g/L $CuCl_2 2H_2O$ and 12.5% HCl), RT
2 min Water Rinse
2 min HCl (20%), RT 2 min Water Rinse
Scrub Water/IPA
VM651/T2902 Adhesion Promoter in 95% Methanol/5% Water
15 min 100°C
SPIE Varnish (1/4, Oxy Sim 600/Toluene), 2 coats, 50 psi Atomization, 10 psi Material (4 μm)
1 hr 100 °C
1 hr 190 °C
Cool to RT
Scrub Water/IPA
Die Attach Bake
    90 min, 165 °C, $N_2$ hood on hotplate
    Cool to RT
    90 min, 165 °C, $N_2$ hood on hotplate
    Cool to RT
    180 min, 190 °C, vacuum oven
    Cool to RT
IPA Rinse
2 min, $O_2$ RIE
IPA Rinse
VM651/T2902 Adhesion Promoter in 95% Methanol/5% Water
15 min 100 °C
Lamination
Peel
24 hour Water Boil
Peel

FIGURE 12

POLYMIDE-TO-SUBSTRATE ADHESION PROMOTION IN HDI

This application claims priority from Provisional application Ser. No. 60/333,204 filed Nov. 6, 2001.

FIELD OF THE INVENTION

This invention relates to methods for making reliable connection of polyimide to copper-, titanium-, andor aluminum-containing substrate materials.

BACKGROUND OF THE INVENTION

High density interconnect assemblages such as those described in U.S. Pat. No. 4,783,695, issued Nov. 8, 1988 in the name of Eichelberger et al., and in numerous other patents, are finding increased usage. In the typical HDI assemblage, a dielectric substrate such as alumina has a planar surface and one or more wells or depressions. Each well or depression extends below the planar surface by the dimension of a component which is to become part of the HDI assemblage. The component is typically an integrated circuit, having its electrical connections or contacts on an upper surface. These contacts or connections are preferably made from titanium-coated copper-containing metals, so that the later formation of through vias by means of lasers exposes titanium, rather than copper, to avoid oxidation of the copper, which oxidation might affect the adhesion of additional layers. Each component is mounted in a well dimensioned to accommodate the component with its contacts in substantially the same plane as the planar surface of the substrate. The components are typically held in place in their wells or depressions by an epoxy adhesive. A layer of dielectric material such as KAPTON polyimide film, manufactured by DuPont of Wilmington, Del., is laminated to the devices using ULTEM polyetherimide thermoplastic adhesive, manufactured by General Electric Plastic, Pittsfield, Mass., which is then heat-cured at about 260° to 300° C. in order to set the adhesive. The polyetherimide adhesive is advantageous in that it bonds effectively to a number of metallurgies, and can be applied in a layer as thin as 12 micrometers ($\mu$m) without formation of voids, and is a thermoplastic material, so that later removal of the polyimide film from the components is possible for purposes of repair by heating the structure to the plastic transition temperature of the polyetherimide while putting tension on the polyimide film.

Following the curing of the ULTEM adhesive layer holding the first sheet of dielectric film onto the components, through via apertures are made through the dielectric film and its adhesive layer at the locations of at least some of the electrical connections. The apertures are typically made by the use of a laser. The laser tends to generate soot as the dielectric and adhesive are vaporized. When the connections are made to copper surfaces, the heat of the laser action also tends to create copper oxides on the connections. The soot and oxides tend to prevent good metal-to-metal contact during later stages of processing which include metal deposition.

Following the drilling of through vias through the first layer of the polyimide film and its polyetherimide adhesive, a patterned layer of titanium/copper/titanium electrical conductors is applied to the exposed surface of the polyimide film, into the through vias, and onto the contacts of the components. This completes the formation of a first layer of electrical connections to the components. One or more additional thin sheets of polyimide dielectric material are layered onto the upper surfaces using silicone polyimide epoxy adhesive (SPIE) as a lamination adhesive. The SPIE is a thermoset material such as OXYSIM 600, manufactured by Occidental Chemical Corporation, Grand Island, N.Y. After application, the SPIE is then cured at temperatures below 200°. Once set, the SPIE cannot be softened by heating. Each additional layer of polyimide film has its own pattern of through vias drilled as far as the upper titanium surface of a lower layer of titanium/copper/titanium conductor, followed by its own layer of titanium/copper/titanium deposition. The titanium/copper/titanium layered metallized or deposited conductors are known to provide reliable interconnections.

It has lately become important to integrate into HDI modules certain components including copper-containing electrical connection materials. Such copper-containing electrical contacts are found in at least on-module connection strips, shielding or grounding members, and magnetic components such as tuned ferrite-loaded coils or transformers. These magnetic components tend to be somewhat larger than solid-state chips, but are dimensioned to be accommodated in the HDI modules for which they are intended. The integration of such modules presents some problems, in that the manufacturers of the components are accustomed to using copper as the main conductive material, and to making the electrical contacts from copper. Copper is not the best material for electrical contacts in an HDI context, because it oxidizes readily, especially in the presence of high temperatures. Neither titanium nor adhesives reliably adhere to oxidized or dirty copper. Even if they initially appear to adhere, the adhesion often fails in the presence of heat or moisture. Thus, a copper surface is not acceptable for HDI connection.

Other possible surfaces were evaluated for deposition on the copper of the magnetic components. Electrically deposited and electroless nickel, tin, and palladium were among the surfaces evaluated. It was found that adhesion of the lamination adhesive to nickel was relatively poor for both titanium and adhesive, regardless of how it was deposited. Tin was discounted as a suitable surface, because of the known problem of formation of dendrites. Palladium was also found not to provide good adhesion.

Thus, the presence of magnetics in HDI contexts requires improved adhesion. Feed-through electrical contacts containing copper require adhesion of the laminating adhesive to the surface of the metal contact. It has also become important to use titanium substrates in place of ceramics in HDI applications, and reliable adhesion to titanium substrates becomes more difficult as the titanium surface ages. Other metallurgies used in HDI contexts, such as aluminum bond pads, also require good adhesion to the lamination adhesive.

Improved HDI processing methods are desired.

SUMMARY OF THE INVENTION

A method for adhering a film of polyimide dielectric to a substrate according to an aspect of the invention, where the substrate may be a component, an actual substrate, or a component-populated substrate, comprises the steps of procuring a film of polyimide dielectric material and a generally planar substrate including one of exposed copper-, titanium-, aluminum-, and copper-and-titanium-containing portions of the substrate. The one of the copper-, titanium-, and copper-and-titanium-containing portions of the substrate is etched with a liquid etchant. In the case of copper-containing portions of the substrate, the etchant is cupric chloride, in the case of titanium-containing portions of the substrate, the etchant is HF, in the case of copper- and titanium-containing portions of the substrate, the etching is performed in two steps, with the first step using HF and the second step using cupric chloride. In the case of aluminum-containing substrate portions, no etching is performed. If etching is performed, the etchant is cleaned from the one of exposed copper-, titanium-, and copper-and-titanium-containing portions of the substrate. The next step is to apply adhesion promoter. In the case of an exposed aluminum-containing portion of the substrate, adhesion promoter is applied to the aluminum-containing portion of the substrate, and in the case of one of the exposed copper-, titanium-, and copper-and-titanium-containing portions of the substrate, adhesion promoter is applied to the one of exposed copper-, titanium-, and copper-and-titanium-containing portions of the substrate after the step of cleaning the etchant. The next step in the method is the curing of the adhesion promoter, to thereby produce a cured adhesion promoter surface. SPIE varnish is applied to the cured adhesion promoter, and cured to form cured SPIE varnish. A layer of adhesion promoter is applied to the cured SPIE varnish to form an adhesive surface, and cured to form a cured adhesive surface. At this stage, the components andor substrate, if not already assembled into a populated substrate, can be so assembled. Finally, the polyimide dielectric material is laminated to the cured adhesive surface.

In particular modes of the method according to the invention, the step of etching the one of the copper-, titanium-, and copper-and titanium-containing portions of the substrate with a liquid etchant includes the step of (a) etching with cupric chloride if the portions contain copper, (b) etching with HF if the portions contain titanium, and (c) etching with both cupric chloride and HF if the portions contain both copper and titanium, with the step of etching with HF preceding the step of etching with cupric chloride. It has been found that good adhesion promoters are VM651, manufactured by HD Microsystems of Parlin, N.J., and T2902, manufactured by United Chemical Technologies. In one variant of the method, the step of applying SPIE varnish to the cured adhesion promoter includes the step of applying SPIE varnish to a thickness of 4 micrometers. In another version, the step of curing the SPIE varnish includes the steps of curing the SPIE varnish for a period of time at a first temperature, and then curing the SPIE varnish for a second period of time at a second temperature, greater than the first temperature. In one avatar, the first and second periods of time each have a duration of about 1 hour. When these durations are used, the curing for a first period of time is performed at about 100° Celsius, and the curing for the second period of time is performed at a temperature of about 190° Celsius. The step of curing the adhesion promoter to thereby produce cured adhesion promoter may be performed for 15 minutes at 100° C. Similarly, the step of curing the adhesive surface to form a cured adhesive surface may be performed for 15 minutes at 100° C. The cured SPIE varnish may be cooled between the steps of curing the SPIE varnish to form cured SPIE varnish and applying a layer of adhesion promoter to the cured varnish to form an adhesive surface.

Thus, a more detailed exposition of the method according to an aspect of the invention, for adhering a film of polyimide dielectric to a substrate, includes the steps of procuring a film of polyimide dielectric material and procuring a generally planar substrate including one of exposed copper-, titanium-, aluminum-, and copper-and-titanium-containing portions of the substrate. The one of the copper-, titanium-, and copper-and-titanium-containing portions of the substrate are etched with a liquid etchant. The etchant is cleaned from the one of exposed copper-, titanium-, and copper-and-titanium-containing portions of the substrate. In the case of an exposed aluminum-containing portion of the substrate, adhesion promoter is applied to the aluminum-containing portion of the substrate, and in the case of one of the exposed copper-, titanium-, and copper-and-titanium-containing portions of the substrate, adhesion promoter is applied to the one of exposed copper-, titanium-, and copper-and-titanium-containing portions of the substrate after the step of cleaning the etchant. The adhesion promoter is cured, possibly for 15 minutes at 100° C., to thereby produce cured adhesion promoter. SPIE varnish is applied to the cured adhesion promoter, and cured to form cured SPIE varnish. The cured SPIE varnish is cooled to form a cooled varnish surface. A layer of adhesion promoter is applied to the cooled varnish surface to form an adhesive surface. The adhesive surface is cured, as for 15 minutes at 100° C., to form a cured adhesive surface. Finally, the polyimide dielectric material is laminated to the cured adhesive surface.

In a particular version, the method includes the steps of procuring a film of polyimide dielectric material and a generally planar substrate including exposed copper-containing portions of the substrate. The copper-containing portions of the substrate are etched with cupric chloride etchant, and the etchant is then cleaned from the substrate. Adhesion promoter is applied to the exposed copper-containing portions of the substrate after the step of cleaning the etchant. The adhesion promoter is cured to thereby produce cured adhesion promoter. SPIE varnish is then applied to the cured adhesion promoter, and cured to form cured SPIE varnish. A layer of adhesion promoter is applied to the cured varnish surface to form an adhesive surface, and the adhesive surface is cured to form a cured adhesive surface. The polyimide dielectric material is laminated to the cured adhesive surface.

In another particular version, the method includes the steps of procuring a film of polyimide dielectric material and a generally planar substrate including exposed titanium-containing portions of the substrate. The titanium-containing portions of the substrate are etched with a HF etchant, and the etchant is cleaned from the exposed titanium-containing portions of the substrate. An adhesion promoter is applied to the exposed titanium-containing portions of the substrate after the step of cleaning the etchant. The adhesion promoter is then cured to thereby produce cured adhesion promoter. SPIE varnish is then applied to the cured adhesion promoter, and cured to form cured SPIE varnish. A layer of adhesion promoter is applied to the cured varnish surface to form an adhesive surface, and the adhesive surface is cured to form a cured adhesive surface. The polyimide dielectric material is laminated to the cured adhesive surface.

In yet another particular version, the method includes the steps of procuring a film of polyimide dielectric material and a generally planar substrate including exposed copper-and-titanium-containing portions of the substrate. The copper-and-titanium-containing portions of the substrate are first etched with HF, and following the etching with HF, etched with cupric chloride etchant. The etchant(s) are cleaned from the exposed copper-and-titanium-containing portions of the substrate. Adhesion promoter is applied to the exposed copper-and-titanium-containing portions of the substrate after the step of cleaning the etchant. The adhesion promoter is cured to thereby produce cured adhesion promoter. SPIE varnish is applied to the cured adhesion promoter to form cured SPIE varnish. A layer of adhesion promoter is applied to the cured varnish to form an adhesive surface, and cured to form a cured adhesive surface. The polyimide dielectric material is then laminated to the cured adhesive surface.

In yet another particular version, the method includes the steps of procuring a film of polyimide dielectric material and a generally planar substrate including exposed aluminum-containing portions of the substrate. In this particular version, adhesion promoter is applied to the aluminum-containing portion of the substrate, and cured to thereby produce cured adhesion promoter. SPIE varnish is applied to the cured adhesion promoter, and cured to form cured SPIE varnish. A layer of adhesion promoter is applied to the cured varnish to form an adhesive surface, and cured to form a cured adhesive surface. The polyimide dielectric material is then laminated to the cured adhesive surface.

BRIEF DESCRIPTION OF THE DRAWING

FIG. 11a is a table listing the adhesion of SPIE laminated to various metals both before and after a 24-hour water boil, and FIG. 11b is a table listing adhesion to titanium for various conditions including presence or absence of adhesion promoter, age of titanium surface, age of adhesion promoter, and the effect of a 24-hour water boil;

FIG. 12 is a list of the salient steps involved in performing lamination to titanium-copper according to an aspect of the invention, including steps involved in testing the strength of the bond.

DESCRIPTION OF THE INVENTION

Figure 1A:
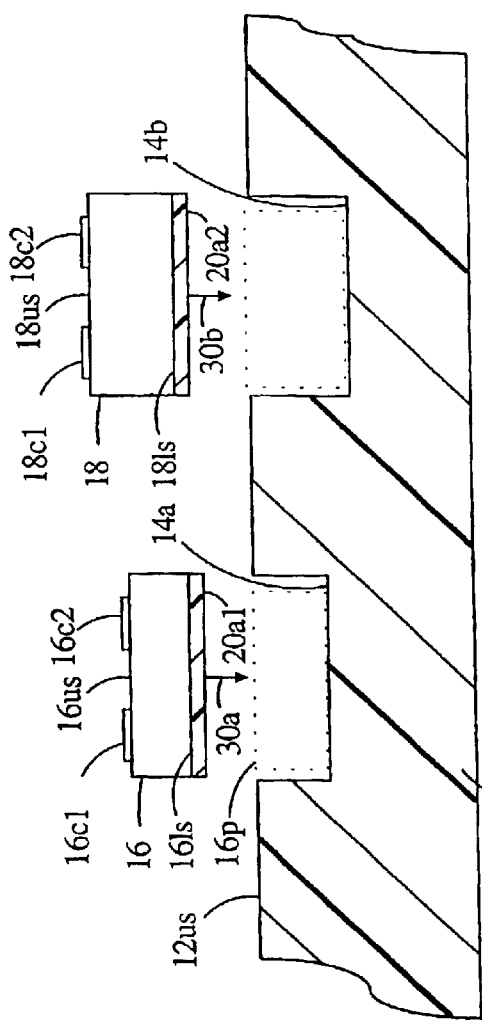
FIG. 1a is a simplified cross-sectional illustration of an HDI substrate defining wells, showing representative components which may be mounted therein.
Figure 1B:
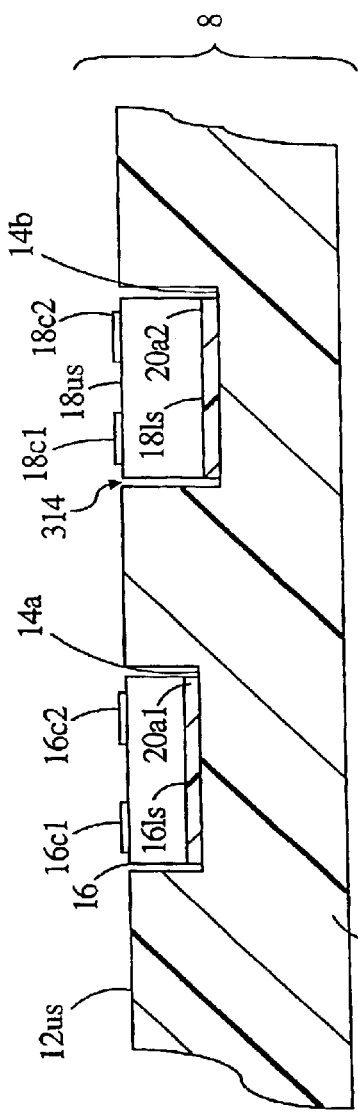
FIG. 1b is a simplified cross-sectional illustration of the HDI substrate of FIG. 1a with the components mounted in the wells.

In FIG. 1a, a high-density-interconnect (HDI) dielectric substrate 12 defines a planar upper surface 12us, and first and second wells 14a and 14b depressed below surface 12us. Instead of wells, through apertures could be used. As illustrated, a first component 16 defines an upper surface 16us and a lower surface 16ls. Upper surface 16us of component 16 bears a plurality of electrical connections, two of which are illustrated as 16c1 and 16c2. The phantom lines 16p illustrate the location of component 16 when mounted in well 14a. When component 16 is mounted within well 14a, the plane of its upper surface 16us is substantially coincident with the plane of upper surface 12us of dielectric substrate 12. Also in FIG. 1a, a second component 18 defines an upper surface 18us and a lower surface 18ls. Upper surface 18us of component 18 bears a plurality of electrical connections, two of which are illustrated as 18c1 and 18c2. The phantom lines 18p illustrate the location of component 18 when mounted in well 14b. When component 18 is mounted within well 14b, the plane of its upper surface 18us is substantially coincident with the plane of upper surface 12us of dielectric substrate 12. The thickness of the electrical connections is normally very small, so that there is essentially no difference between the upper surface of the component and the plane of the connections. Components 16 and 18 are illustrated as having different thicknesses, as measured between their upper and lower surfaces. This might be the case if, for example, component 16 were an integrated circuit and component 18 were a magnetic component such as a transformer or some component other than a solid-state chip. FIG. 1b illustrates the components 16 and 18 of FIG. 1a mounted within the wells 14a and 14b, respectively, of the substrate 12 of FIG. 1a, by the use of adhesive or epoxy 20a1 and 20a2, respectively.

Figure 2:
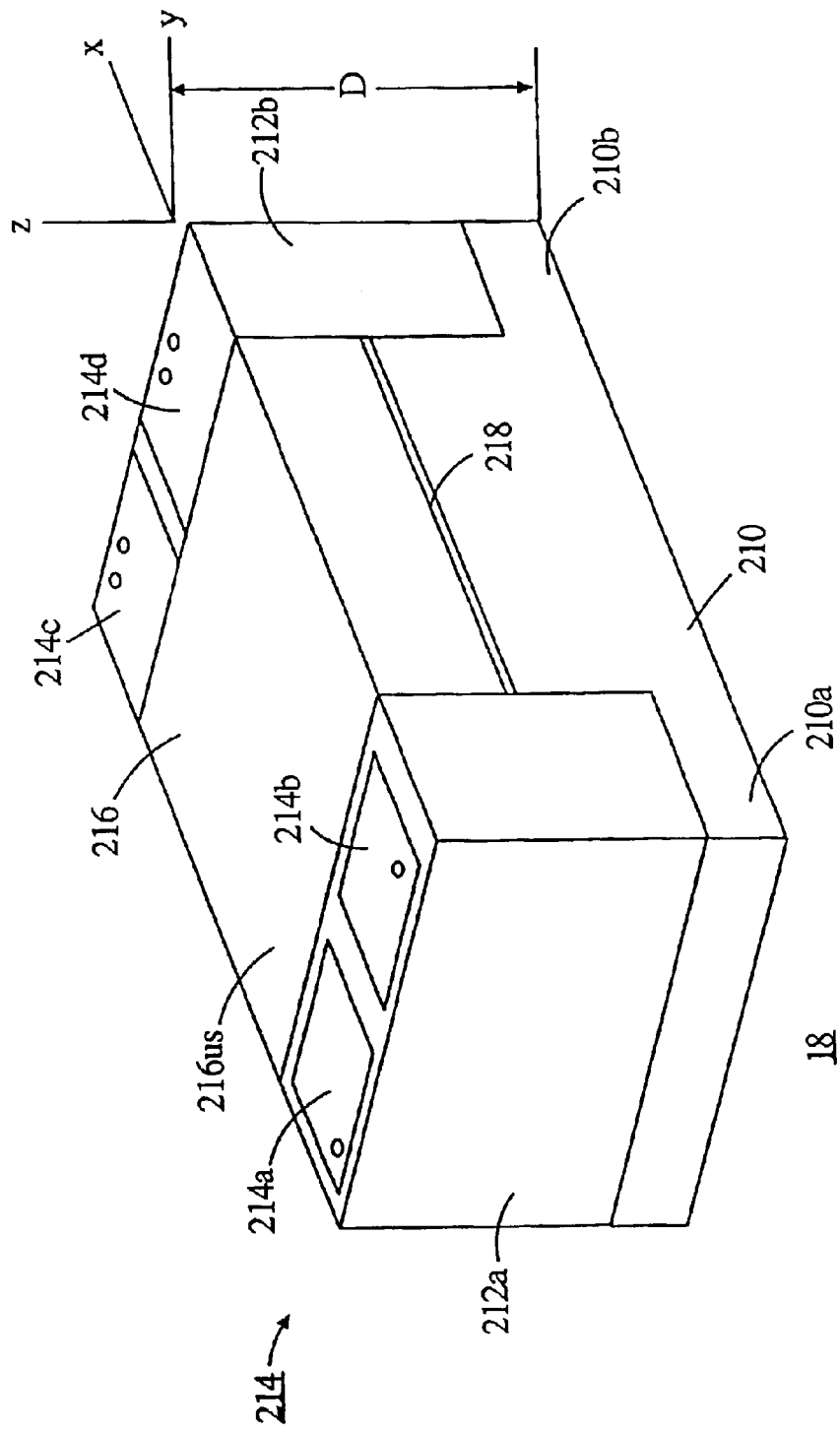
FIG. 2 is a simplified perspective or isometric external view of a magnetic component which might be used in an HDI context, showing possible electrical contact locations.

FIG. 2 illustrates a magnetic component which corresponds with component 18 of FIG. 1a. In FIG. 2, the magnetic component is illustrated as having an elongated cubic shape. A lower portion designated 210 is a ferrite slab, having ears 210a and 210b. Ear 210a supports a roughly cubic insulator 212a, and ear 210b supports a similar insulator 212b. Insulators 212a and 212b have a set 214 of deposited copper or copper-containing, mutually isolated connection electrodes formed or placed on their planar upper surfaces. Insulator 212a supports copper-containing, mutually-electrically-isolated contact electrodes 214a and 214b, and insulator 212b supports similar copper-containing mutually isolated connection electrodes 214c and 214d on its planar upper surface, coplanar with electrodes 214a and 214b. All or some of the electrical contact electrodes of set 214 make connection with turns of conductor associated with the ferrite body 210. FIG. 2 also illustrates a ferrite lid or cap 216, which joins ferrite element 210 in conventional fashion to form a closed magnetic path. The upper surface 216us of lid 216 is substantially coplanar with the electrodes 214a, 214b, 214c, and 214d. A structure similar to that of FIG. 2 may be used as a transformer, or it may be used as an inductor, in which case only two of the electrodes would be necessary, rather than four. In one advantageous embodiment, the magnetic element is part of a resonant circuit, which may include nonmagnetic elements located within the body of element 18. In such a structure, tuning of the resonant circuit is accomplished by fastening lid 216 to ferrite part 210 with epoxy or other hardenable adhesive, and applying force to or "pressing" the lid 216 while the epoxy or adhesive is soft or uncured so as to obtain suitable tuning performance, and leaving the lid in the correct position until the epoxy or adhesive hardens or sets. It has been found that the material 218 is somewhat sensitive to temperature, in that it may be damaged at temperatures in excess of about 180° C. If magnetic component 18 of FIG. 2 were to be used as component 18 of FIG. 1a or 1b, electrode 214b of FIG. 2 might be deemed to correspond with connection 18c1 of FIGS. 1a and 1b, and electrode 214d of FIG. 2 to correspond to connection 18c2 of FIGS. 1a and 1b.

The copper-containing connection electrodes 214a, 214b, 214c, and 214d of component 18 of FIG. 2 are cleaned, and then coated with a material which both protects the copper against oxidation and to which adhesion of other materials is good. The cleaning can be performed in many ways, but one way includes degreasing by wiping the copper surface with acetone, followed by isopropyl alcohol (IPA), then drying. After the drying, controlled copper removal is performed by means of a two-minute copper chloride etchant with MicroEtch at 14.8 g/L $CuCl_2 2H_2O$ and 12.5% HCl. The etching step is preferably accomplished by spot application of the etchant to the copper surface itself, rather than by immersion of the entire component 18 of FIG. 2, to avoid possible penetration or perfusion of the etchant into the interior of the component. The copper chloride etching step is followed by a two-minute water rinse, in turn followed by a two-minute 20% hydrochloric acid (HCL) exposure at room temperature, again preferably without immersion. Water rinses are preferably deionized water rinses. Following the HCl exposure, a further two-minute water rinse is performed, followed by a high-pressure water scrub, and an isopropyl alcohol (IPA) drying chaser. The copper-containing electrode material is deemed to be clean following the cleaning steps. The coating steps should be performed soon after the cleaning, to avoid re-oxidization of the copper-containing material of the electrical contacts.

The next step in the preparing the set 214 of electrodes of FIG. 2 for coating is the step of adhesion promotion. Many types of adhesion promoters can be used, but the system used in a mode of the method includes silane coupling agents. More particularly, type VM651 adhesion promoter, manufactured by HD Microsystems of Parlin, N.J., or General Chemical Technologies type T2902 adhesion promoter can be used. The selected adhesion promoter is dissolved in 95% methanol, 5% water, to a concentration of about 0.01%, and the resulting solution is applied to the copper-containing surfaces to be protected, as by swabbing (for discrete electrodes) or spin-coating (for flat surfaces). A drying step of baking for 15 minutes at 100° C. follows the application of the adhesion promoter.

Figure 3:
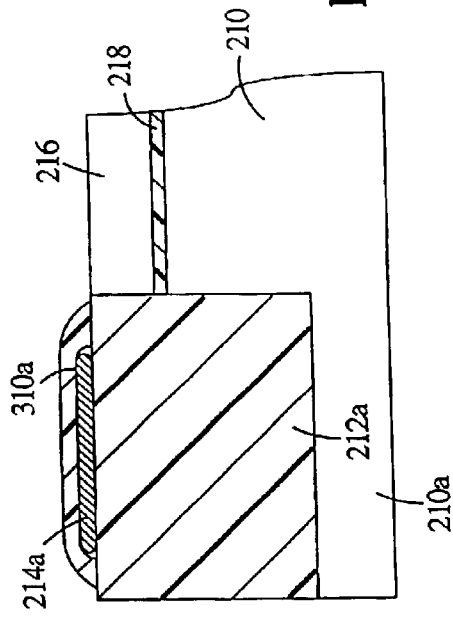
FIG. 3 is a simplified cross-section of a portion of the component of FIG. 2 illustrating coating of the copper-containing connection electrode with SPIE.

Further, the cleaned copper-containing, adhesion-promoted electrodes of the component, or other copper-containing surfaces to be protected, are immediately coated with silicone polyimide epoxy (SPIE), which is the same thermoset material which is used to bond together upper layers of the HDI interconnect. It has been found that this material provides adequate protection of the copper-containing material of the component during those times in which the component is being processed for mounting on an HDI substrate. More particularly, one part of Oxy Sim 600 SPIE is combined with four parts of solvent to make the solution which is applied. In one version of this coating, the solvent is toluene. Two coats of the SPIE material are applied in this version, to any desired thickness, which in one version is 4 micrometers ($\mu$m). Following the application of the SPIE solution to the copper-containing electrodes, two bakes are performed, the first to remove or drive off the solvent, the second to cure the epoxy. These bakes are 1 hour at 100° C. and 1 hour at 190° C., respectively. FIG. 3 illustrates a cross-section of component 18 of FIG. 2 in the region of contact or connection electrode 214a, showing the protective layer 310a of SPIE thereon.

Following the baking steps, the copper-containing material or set 214 of electrodes of FIG. 2, including electrode 214a of FIG. 3, is (or are) brought to room temperature, and the component 18 of FIG. 2 is prepared for component or die attachment by means of another pressure wash with water followed by drying with isopropyl alcohol. The component or die attachment is performed in conventional HDI manner as suggested in conjunction with FIGS. 1a and 1b; in one version, a thermoset epoxy such as 20a1 and 20a2 of FIG. 1b is applied in (or to) the wells 14a and/or 14b, or to the underside of the components, and the component is inserted into the well as suggested by the arrows 30a, 30b of FIG. 1a, to form a populated substrate (the HDI substrate 12 with its attached components such as 16, 18) 8 as illustrated in FIG. 1b. The entire populated substrate 8 is then baked 90 minutes at 165° C., preferably under a $N_2$ hood, and then cooled to room temperature to cure the adhesive. If additional components are to be added to a partially populated substrate, the thermoset epoxy is added to the additional wells with the appropriate components, followed by another baking for 90 minutes at 165° C. These additions of adhesive and components to the wells, and the bakings and coolings, can continue until all components have been attached. Following the baking of the last adhesive, the populated HDI substrate 8 is outgassed by baking at 190° C. for 180 minutes in a vacuum oven. The populated substrate 8 is then cooled to room temperature. This completes the die or component attachment. The SPIE coating 310 on the set 214 of copper-containing electrodes of the component 18 protects the copper against oxidation at the baking temperatures required to set and outgas the adhesives during die attachment. In preparation for the next step, which is lamination, it may be desirable to fill any gaps, such as gap 314 of FIG. 1b, lying between substrate 12 and the component 18, with an epoxy or other filler material. The filler material is illustrated as 410 of FIG. 4.

The populated substage 8 is prepared for lamination by cleaning. The cleaning is performed by a process beginning with an isopropyl alcohol (IPA) rinse.

The IPA rinse is followed by a two-minute $O_2$ reactive ion etch (RIE), which is a trifle more aggressive than an oxygen cleaning plasma. This is followed by another IPA rinse.

Figure 4:
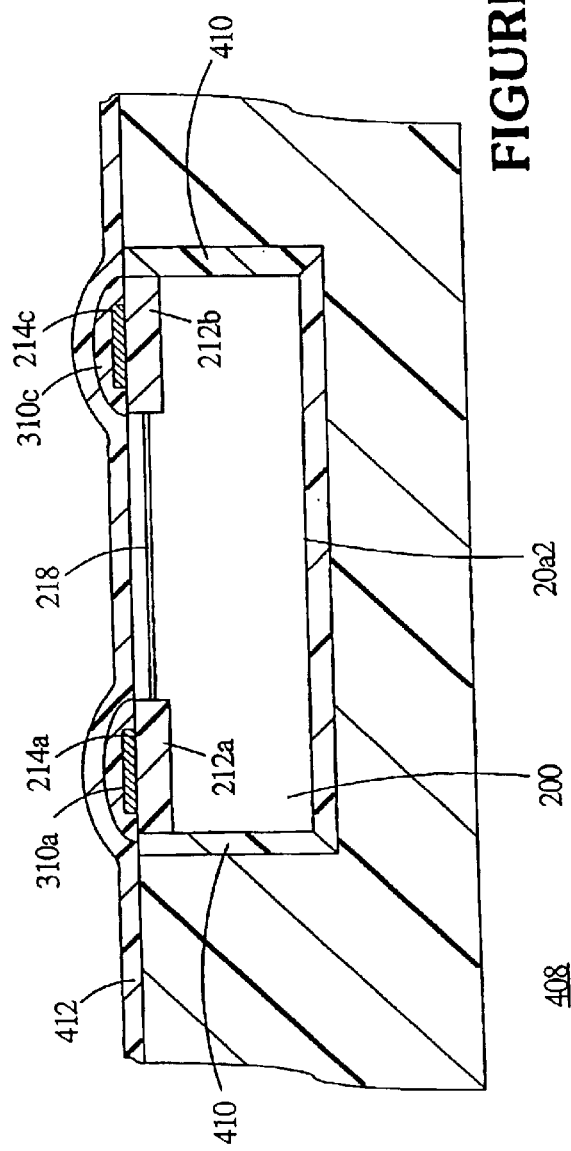
FIG. 4 is a simplified cross-section of the component of FIG. 2 mounted in the manner shown in FIG. 1b, with a layer of adhesion promoter applied thereon.

Following the cleaning, the upper surface of the populated substrate 8 is prepared for lamination by adhesion promotion. The preparation includes dissolving the VM651 or T2902 adhesion promoter in 95% methanol, 5% water, to a concentration of about 0.01%, and application of the resulting solution to the entire upper surface of the populated substrate, as by swabbing or spin-coating, to form an adhesion promoter coating illustrated as 412 in FIG. 4. A drying step of baking for 15 minutes at 100° C. follows the application of the adhesion promoter solution to the surface. The populated substrate with adhesion promoter 408 as illustrated in FIG. 4 is now ready for lamination.

Figure 5A:
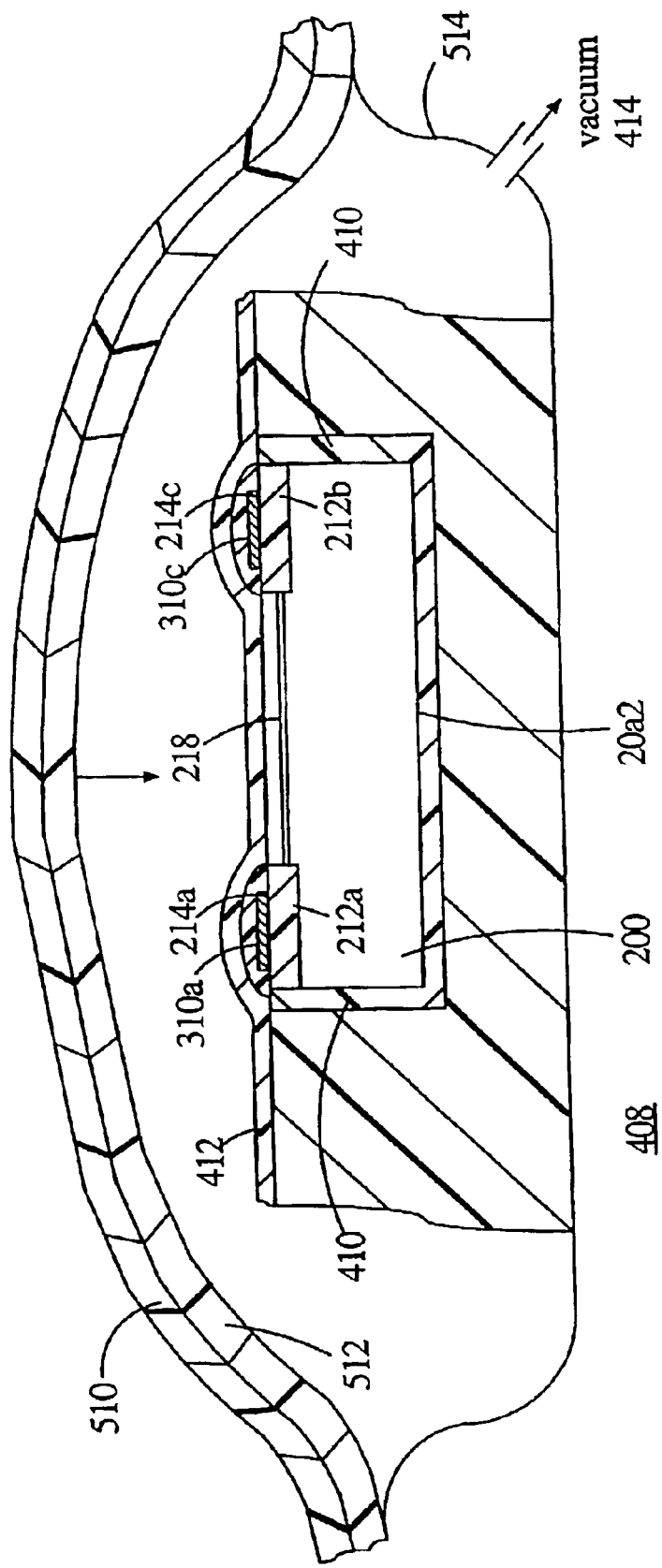
FIG. 5a illustrates vacuum application of uncured-SPIE-coated KAPTON polyimide sheet to the upper surface of the structure of FIG. 4.
Figure 5B:
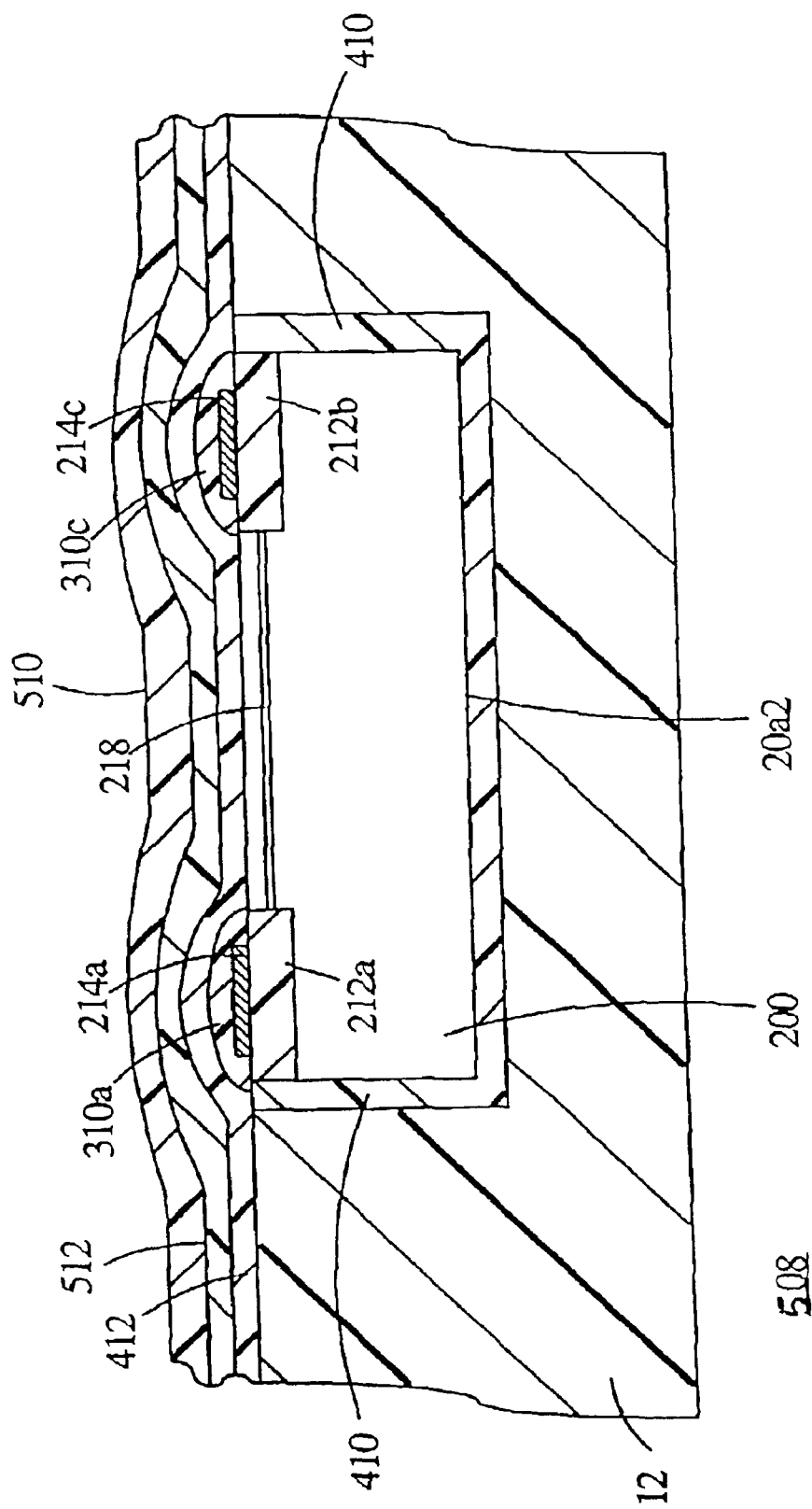
FIG. 5b illustrates the resulting structure.

In general, the lamination is accomplished by use of a vacuum, which brings an uncured-SPIE-coated film of KAPTON polyimide 510 into contact with the adhesion promoter 412 already applied to the contact areas of the populated substrate 408. More particularly, a sheet 510 of KAPTON polyimide is cleaned and coated with a layer 512 of uncured SPIE, as illustrated in FIG. 5a. In one version, the thickness of the SPIE layer was 20 ($10^{-6}$) meter, corresponding to ⅕($10^{-4}$) meter. The uncured-SPIE-coated polyimide sheet 510, 512 is applied over the opening of a vacuum vessel 514 containing the populated substrate 408, and a vacuum 414 is applied to move the uncured SPIE layer 512 of its supporting KAPTON polyimide sheet 510 in the direction of arrow 516, and into contact with the adhesion promoter 412 of the populated substrate 408. The SPIE layers bond together through the intermediary adhesion promoter, thereby attaching the KAPTON dielectric sheet 510 to the populated substrate 408 including the copper-material electrodes or connections of set 214, to produce a protected populated substrate 508, illustrated in FIG. 5b. The surface of the populated substrate 508 is now sealed or protected, and further processing can be deferred, if desired. It should be noted that the attachment of the first layer 510 of KAPTON dielectric material to the populated substrate is made with SPIE layer 512, rather than with the ULTEM polyetherimide which is conventionally used. The reason for this is that the ULTEM requires processing at temperatures exceeding 190 degrees C., at which temperatures the ferrite-cap 216 attachment epoxy 218 of FIGS. 2 and 5a, 5b would be damaged. Also, regardless of the characteristics of the lid attachment epoxy 218, the close tolerances involved in attachment of the ferrite lid 216 and the insulators 212a and 212b to the ferrite body 210, and the conductors which are located within the ferrite body, requires that the temperature excursions be moderate to prevent damage to the magnetic element 18.

Figure 6:
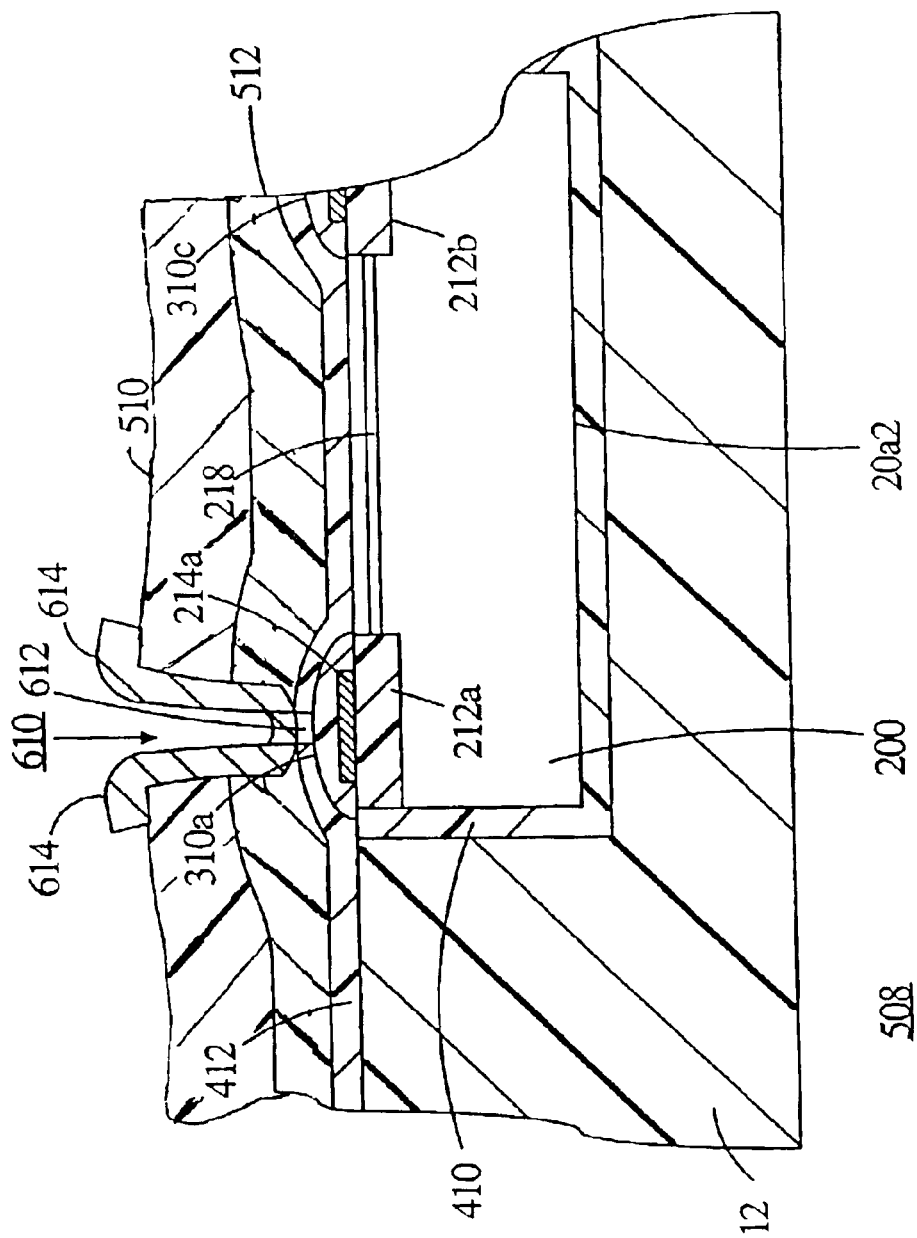
FIG. 6 illustrates the result of laser via drilling through a portion of the structure of FIG. 5b.

Following the lamination of the first layer 510 of KAPTON dielectric to the populated substrate 508, the vias are laser-drilled in conventional manner over the locations of at least some of the copper-containing electrical contacts of set 214 of the components, down to the copper-containing material. One via 610 is illustrated in FIG. 6. The laser drilling generates soot and heat, and the localized heat tends to generate copper oxides at the exposed surface of the copper-containing contact. The oxides are represented as a layer 612 lying on copper-containing electrode 214a, and the soot is illustrated as a layer of material 614 extending over the surface of the via 610 and over the oxide surface 612.

A cleaning step cleans soot 614 from the exposed surfaces, including the via(s) 610 and the exposed 10 copper-containing material 612 at the bottoms of the via(s) 610, and from the regions around the drilled via, where soot may accumulate. The soot removal is performed by any conventional means, using reactive plasmas such as $CF_4$ plasma and/or oxygen plasma. The soot tends to be in the form of silicon-containing compounds, which tend not to be volatile. The oxygen plasma, if used, oxidizes and vaporizes the carbon compounds associated with the soot. The fluorine-based plasma attacks the silicon-containing compounds, and converts them to volatile silicon tetrafluoride. If the copper-containing electrode were to be coated with titanium, the fluorine-based plasma etch would also attack the titanium surface, converting it to volatile $TiF_4$. Following the soot removal, copper oxide removal is performed.

Figure 7:
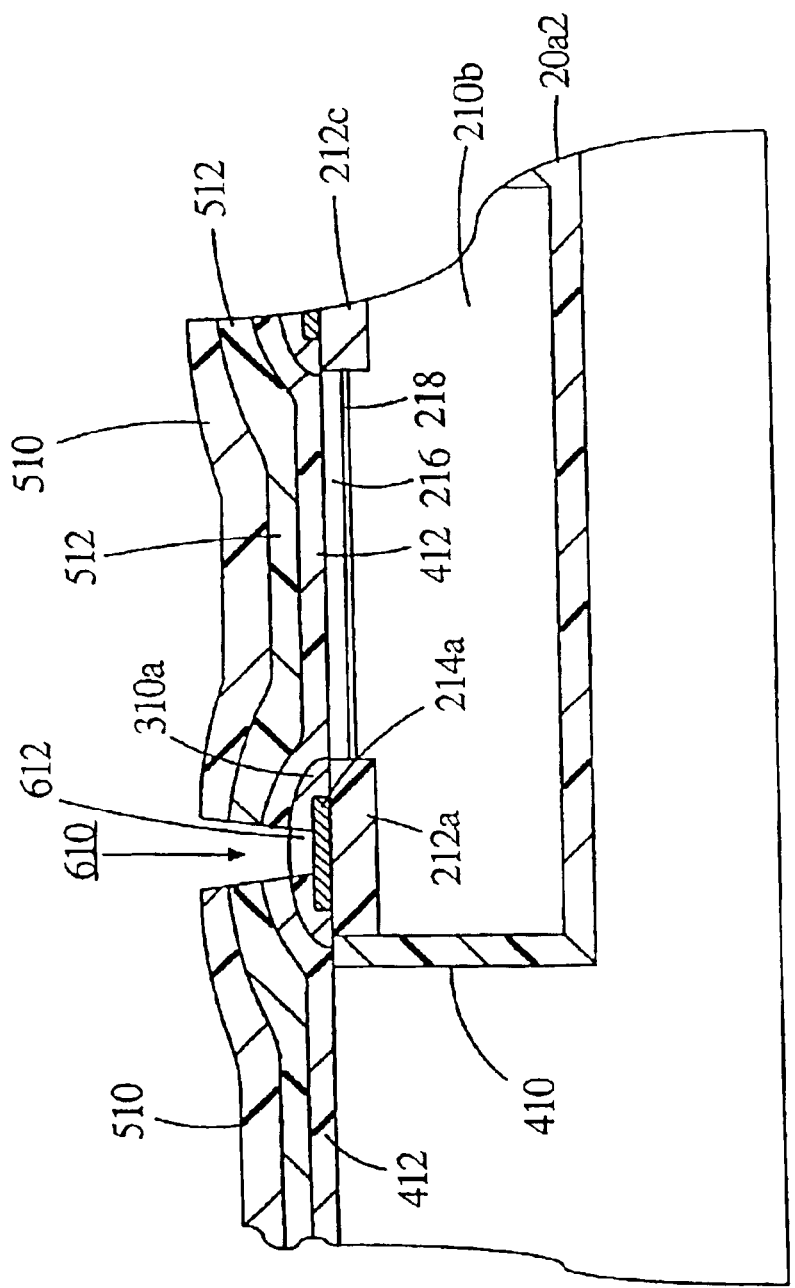
FIG. 7 illustrates the result of soot removal from the laser-drilled vias of FIG. 6.
Figure 8:
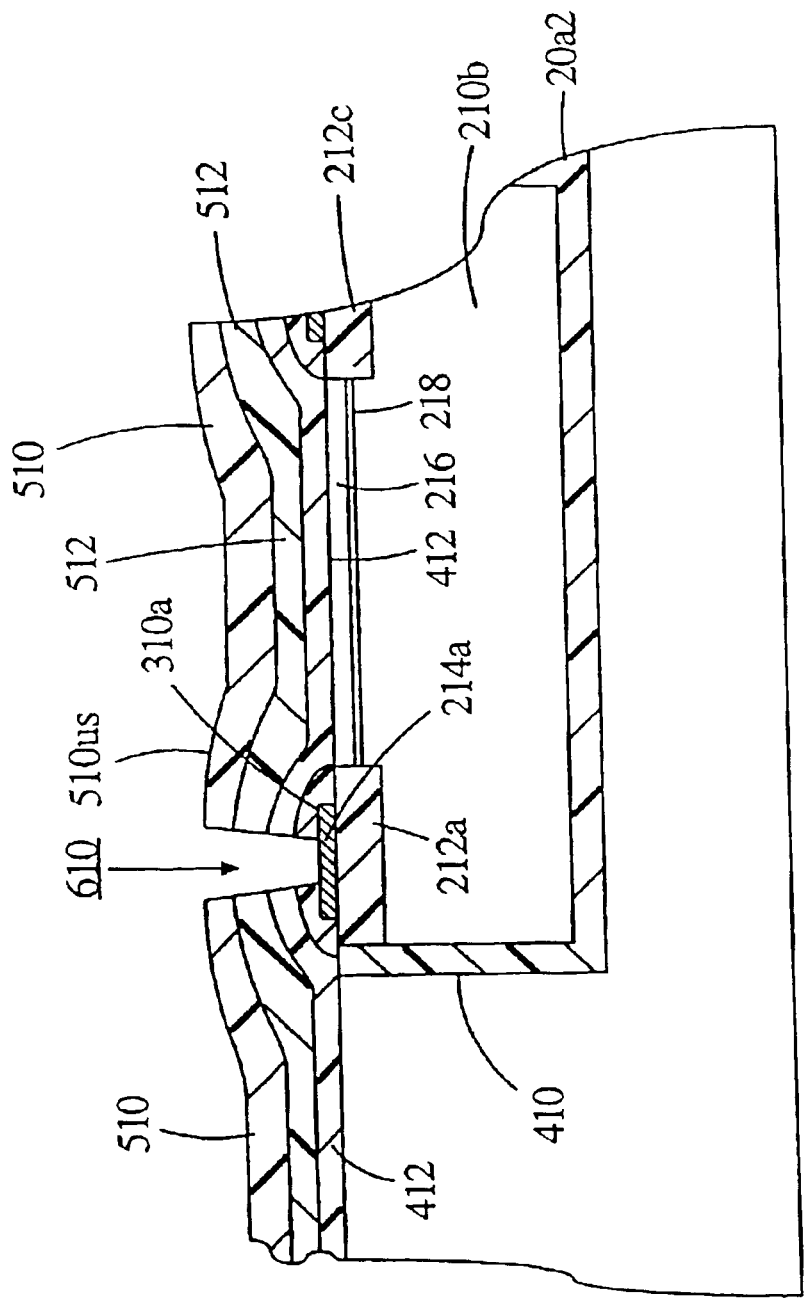
FIG. 8 illustrates the result of cleaning of that portion of the electrical contacts exposed by the vias in the soot-cleaned structure of FIG. 7.
Figure 9:
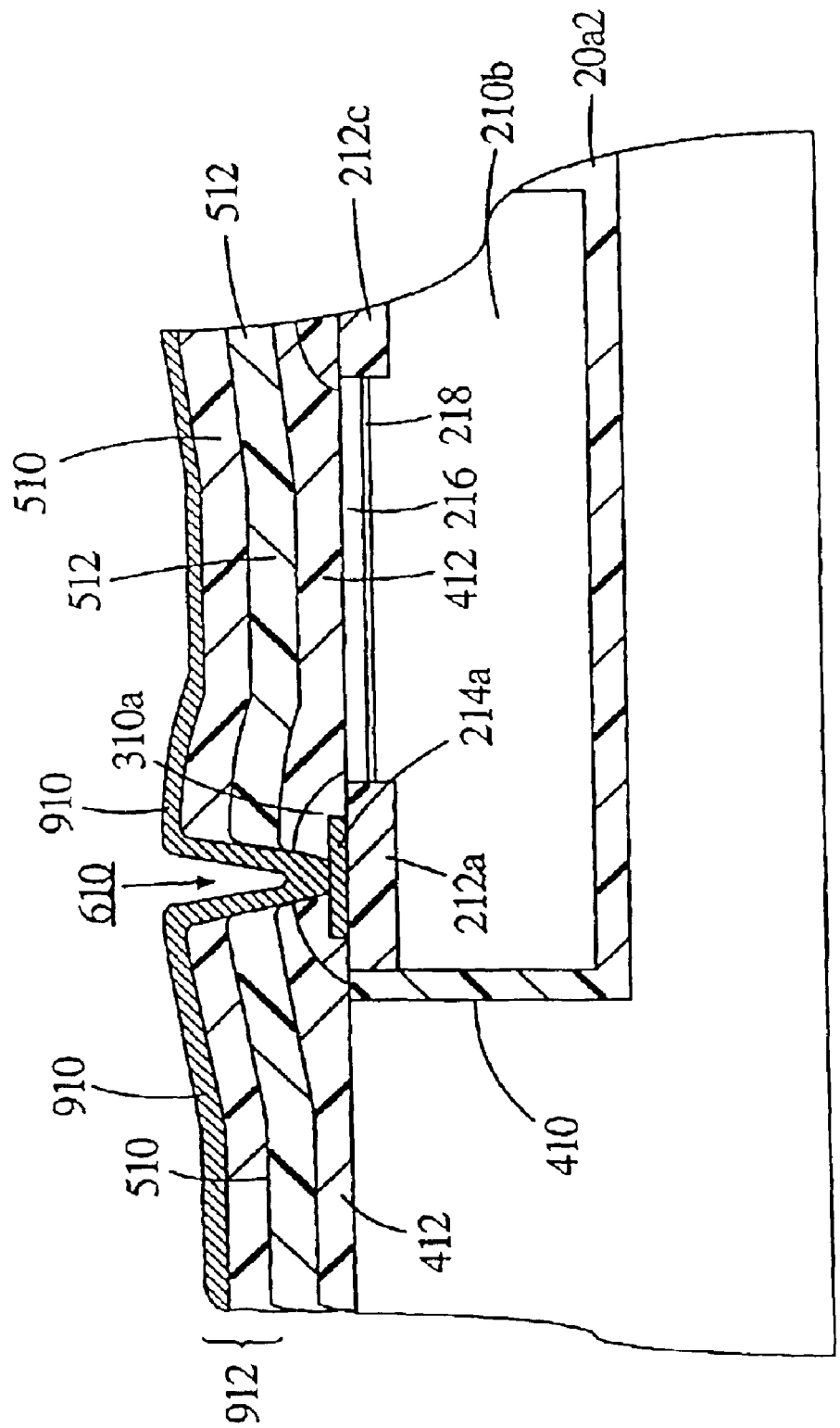
FIG. 9 illustrates the result of metallizing the exposed surface of the KAPTON polyimide sheet to define a first layer of HDI interconnection.

In the described situation, the laser drilling goes to a copper-containing layer, not a titanium layer. Consequently, the copper oxides contained in layer 612 must be removed or cleaned after the soot removal. The soot removal should precede the copper oxide cleaning, so that the presence of the soot does not interfere with the oxide removal. FIG. 7 illustrates the structure of FIG. 6, with the soot removed, which exposes the copper oxide containing layer 612. The copper oxide removal is accomplished by a second plasma treatment, which is a reactive argon plasma cleaning. Reactive argon plasma treatment is a conventional process, although it is not normally used in the context of HDI processing. The argon plasma cleaning of the copper-containing conductor electrode portions exposed at the bottoms of the vias is performed by exposing the entire laminated, populated substrate 708 of FIG. 7, with via(s) 610 exposing the copper-containing electrodes 214a to be cleaned, to the argon plasma. KAPTON is removed by the argon plasma at a rate of less than 40 Angstroms per minute. The argon plasma etch may be for a period of about 20 minutes, which has been found to be sufficient to remove copper oxides in the described aspects of the method. However, longer or shorter periods of time may be used, as needed or desired, so long as the copper-containing electrodes are sufficiently cleaned of oxides, and the KAPTON film is not excessively thinned. The resulting laminated, cleaned substrate with vias is illustrated in FIG. 8, and is ready for metallization of the first layer of KAPTON in order to define the interconnection pattern. The condition of the substrate at this point is identical to the situation of a substrate during conventional HDI processing, and can proceed in known manner. Since clean copper is again exposed at the bottoms of the vias, the metallization steps should be performed immediately. In short, this known manner includes the steps of metallizing the KAPTON and the vias with sputtered titanium, followed by sputtered copper, followed by electroplated copper, followed by sputtered titanium, all with patterning as may be required to define the conductive paths. FIG. 9 illustrates the composite layer 910 of metallization applied over the surface of KAPTON polyimide layer 510, to thereby form an interconnection sheet designated 912. After the first layer of HDI interconnect is complete, additional layers can be added in known manner.

While the abovedescribed matter relates to improved adhesion to copper, a related method improves the adhesion of the laminated dielectric to a titanium-containing substrate. In general, the titanium substrate is cleaned of debris and the surface layer of metal is removed. The freshly prepared surface is coated with a thin layer of adhesive, and the adhesive is cured. Dielectric layers are then laminated onto the surface.

Figure 10:
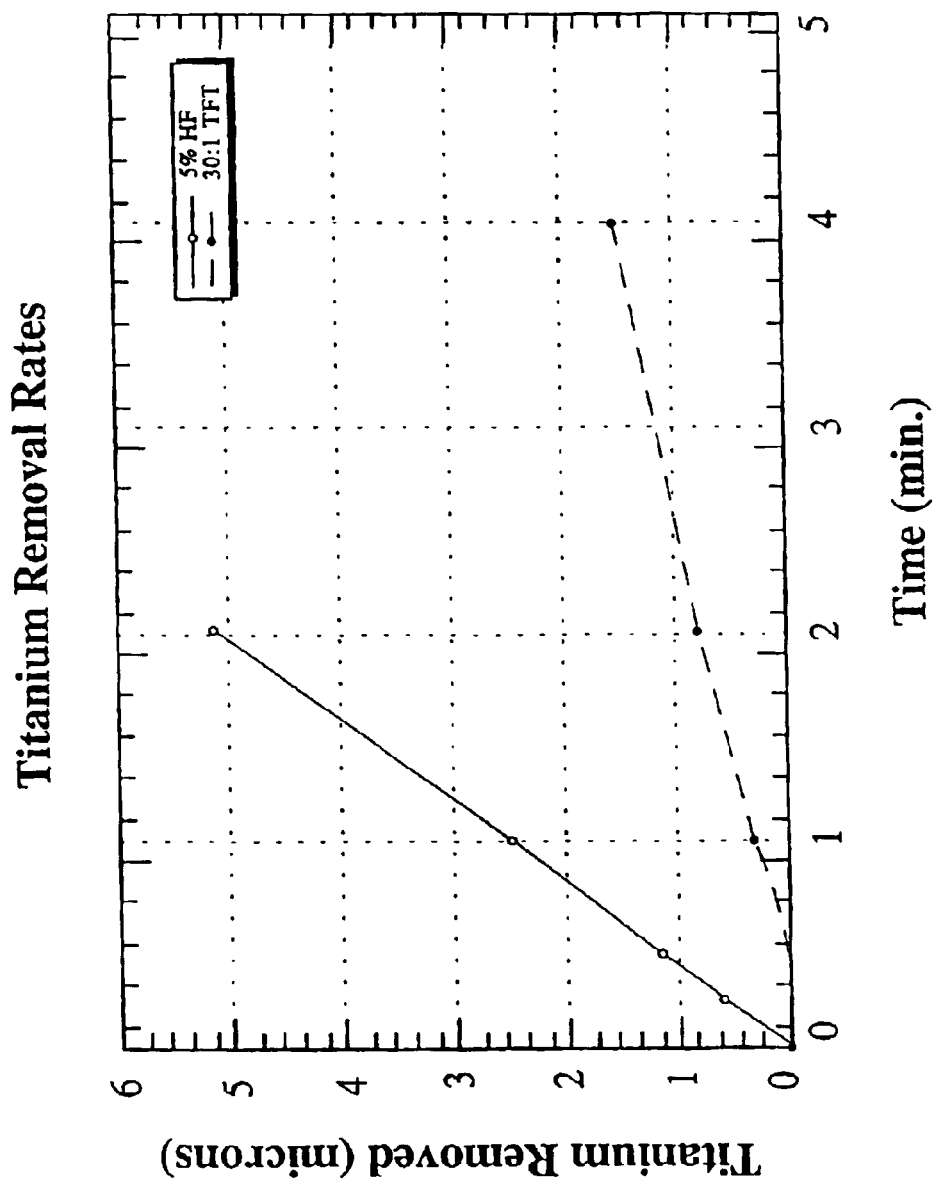
FIG. 10 is a plot illustrating the rate of removal of titanium in the presence of etchant.

In one mode or method, titanium samples were degreased or cleaned with acetone and isopropyl alcohol (IPA). The surface was dried. A surface layer of titanium was removed by immersion for one minute in dilute (5%) aqueous hydrofluoric (HF) acid. The rates of titanium removal are illustrated in FIG. 10. A 2-minute water rinse, followed by water scrub and drying with IPA, is then performed. Adhesion promotion is enhanced by application of VM651/T2902 adhesion promoter in 95% methanol, 5% water. The samples are then baked at 100° C. for 15 minutes. Two coats of SPIE varnish (one part OxySim 600 to four parts of toluene) are then applied at 50 PSI atomisation, 10 PSI material (4 micrometers). The varnish is baked for 1 hour at 100° C. and for another hour at 190° C. Following the baking, the samples were allowed to return to room temperature, and then scrubbed with water and dried with IPA.

The die attach baking was then performed for 90 minutes at 165° C. on a hotplate, in a nitrogen atmosphere under a hood. The samples were then allowed to return to room temperature. Another baking was done for 90 minutes at 165° C. on a hotplate, in a nitrogen atmosphere under a hood, and the samples were again allowed to return to room temperature. Finally, the samples were baked for 180 minutes at 190° C. in a vacuum oven, and cooled to room temperature.

Following the die attach baking, an IPA rinse was performed on the titanium samples. A two-minute reactive ion etching (RIE) in $O_2$ was performed, followed by another IPA rinse. VM651/T2902 adhesion promoter in 95% methanol, 5% water was applied, followed by 15 minutes of baking at 100° C. The samples were then laminated with SPIE-coated KAPTON polyimide film. Peel tests were performed both before and after a 24-hour water boil. The results are set forth in the tables of FIGS. 11a and 11b. As can be seen in the tables, some of the samples provided more than 8 pounds per linear inch after the 24 hour water boil.

Figure 13:
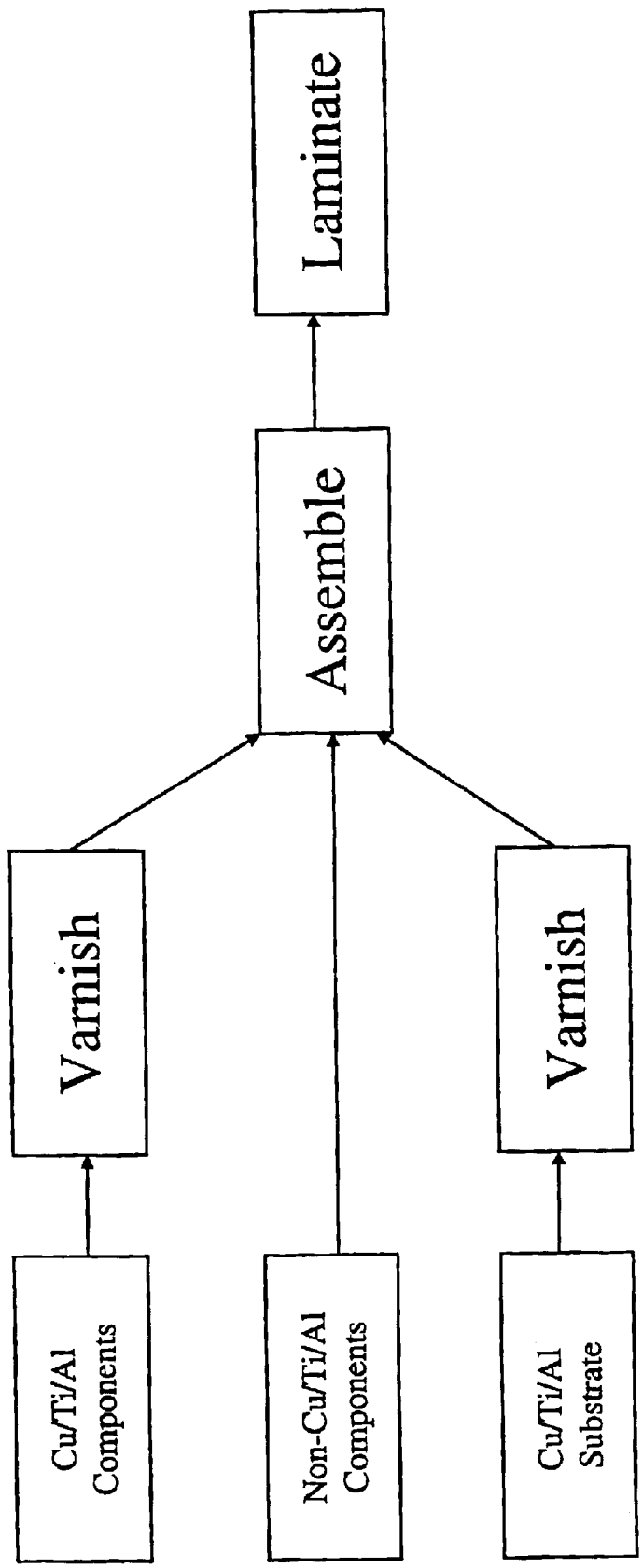
FIG. 13 is an overview of the preferred component process flow.

When both copper and titanium are present (and where stainless steel or ceramic may be present), a combination process as set forth in FIG. 12 is used. FIG. 13 sets out the results for various metals Processing for aluminum is identical to that for copper or titanium, except that the step of etching with copper chloride or with HF (or both) is not used.

FIG. 13 illustrates the process flow for components and/or substrates having various metallurgies, to emphasize that the preferred method applies the SPIE varnish to the various components and substrates individually, before they are combined to form populated substrates. If the metallurgies of all the components of the populated substrate were suitable for SPIE varnishing steps, the populated substrate could be processed as a whole, but in general some of the populating components will not be amenable to the various processing steps, such as immersion. Even if the populated substrate as a whole is capable of being processed, the time required between the cleaning and adhesion promotion steps and the application of SPIE varnish may be so great, when the entire structure is treated, that some copper corrosion or titanium aging may occur, so processing of the individual components and substrate are desirable. As illustrated in FIG. 13, components (or substrates) having non-copper, -titanium, and -aluminum metallurgies require no application of SPIE varnish, and proceed to the assembly stage. Those components having copper, titanium or aluminum are separately processed by application of SPIE varnish before assembly, and those substrates having copper, titanium or aluminum are separately processed by application of SPIE varnish before assembly. After assembly of the components into the substrate to produce a populated substrate, the lamination steps are performed.

Other embodiments and methods of the invention will be apparent to those skilled in the art. For example, the dielectric substrate 12 of FIG. 1a may be metallized on one or more of its surfaces, including interior surfaces of some or all wells, as may be desired for electrical shielding or continuity.

What is claimed is:

1. A method for adhering a film of polyimide dielectric to a substrate, said method comprising the steps of:

procuring a film of polyimide dielectric material;

procuring a generally planar substrate including one of exposed copper-, titanium-, aluminum-, and copper-and-titanium-containing portions of said substrate;

etching said one of said copper-, titanium-, and copper-and-titanium-containing portions of said substrate with a liquid etchant;

cleaning said etchant from said one of exposed copper-, titanium-, and copper-and-titanium-containing portions of said substrate;

in the case of an exposed aluminum-containing portion of said substrate, applying adhesion promoter to said aluminum-containing portion of said substrate, and in the case of one of said exposed copper-, titanium-, and copper-and-titanium-containing portions of said substrate, applying said adhesion promoter to said one of exposed copper-, titanium-, and copper-and titanium-containing portions of said substrate after said step of cleaning said etchant, to thereby form adhesive-applied aluminum/copper-titanium portions of said substrate;

curing said adhesion promoter on said adhesive-applied aluminum/copper-titanium portions of said substrate to thereby produce cured adhesion promoter;

applying SPIE varnish to said cured adhesion promoter;

curing said SPIE varnish to form cured SPIE varnish;

applying a layer of adhesion promoter to said cured SPIE varnish to form an adhesive surface;

during said adhesive surface to form a cured adhesive surface; and laminating said polyimide dielectric material to said cured adhesive surface.

2. A method according to claim 1, wherein said step of etching said one of said copper-. titanium-, and copper-and-titanium-containing portions of said substrate with a liquid etchant includes the step of (a) etching with cupric chloride if said portions contain copper;

(b) etching with HF if said portions contain titanium; and (c) etching with both HF and cupric chloride if said portions contain both copper and titanium, with the step of etching with HF preceding the step of etching with cupric chloride.

3. A method according to claim 1, wherein said step of applying SPIE varnish to said cured adhesion promoter includes the step,of applying SPIE varnish to a thickness of 4 micrometers.

4. A method according to claim 1, wherein said step of curing said SPIE varnish includes the steps of curing said SPIE varnish for a period of time at a first temperature, and then curing said SPIE varnish for a second period of time at a second temperature, greater than said first temperature.

5. A method according to claim 4, wherein said first and second periods of time each have a duration of about 1 hour.

6. A method according to claim 5, wherein said curing for a first period of time is performed at about 100° Celsius, and said curing for said second period of time is performed at a temperature of about 190° Celsius.

7. A method according to claim 1, wherein said step of curing said adhesion promoter to thereby produce cured adhesion promoter is performed for 15 minutes at 100° C.

8. A method according to claim 1, wherein said step of curing said adhesive surface to form a cured adhesive surface is performed for 15 minutes at 100° C.

9. A method according to claim 1, wherein, between said steps of curing said SPIE varnish to form cured SPIE varnish and applying a layer of adhesion promoter to said cured varnish to form an adhesive surface, the further step is performed of:

cooling said cured SPIE varnish.

10. A method for adhering a film of polyimide dielectric to a substrate, said method comprising the steps of:

procuring a film of polyimide dielectric material;

procuring a generally planar substrate including one of exposed copper-, titanium-, aluminum-, and copper-and-titanium-containing portions of said substrate;

etching said one of said copper-, titanium-, and copper-and-titanium-containing portions of said substrate with a liquid etchant;

cleaning said etchant from said one of exposed copper-, titanium-, and copper-and-titanium-containing portions of said substrate;

in the case of an exposed aluminum-containing portion of said substrate, applying adhesion promoter to said aluminum-containing portion of said substrate, and in the case of one of said exposed copper-, titanium-, and copper-and-titanium-containing portions of said substrate, applying adhesion promoter to said one of exposed copper-, titanium-, and copper-and-titanium-containing portions of said substrate after said step of cleaning said etchant, to thereby produce one of adhesion-promoter-applied exposed copper-titanium-, and copper-and-titanium-containing portions of said substrate;

curing for 15 minutes at 100° C. said adhesion promoter of said one of adhesion-promoter-applied exposed copper-titanium-, and copper-and-titanium-containing portions of said substrates, to thereby produce cured adhesion promoter;

applying SPIE varnish to said cured adhesion promoter;

curing said SPIE varnish to form cured SPIE varnish;

cooling said cured SPIE varnish to form a cooled varnish surface;

applying a layer of adhesion promoter to said cooled varnish surface to form an adhesive surface;

curing said adhesive surface for 15 minutes at 100° C. to form a cured adhesive surface; and laminating said polyimide dielectric material to said cured adhesive surface.

11. A method for adhering a film of polyimide dielectric to a substrate, said method comprising the steps of:

procuring a film of polyimide dielectric material;

procuring a generally planar substrate including exposed copper-containing portions of said substrate;

etching said copper-containing portions of said substrate with cupric chloride etchant;

cleaning said etchant from said exposed copper-containing portions of said substrate;

applying a first layer of adhesion promoter to said exposed copper-containing portions of said substrate after said step of cleaning said etchant;

curing said adhesion promoter of said first layer of adhesion promoter to thereby produce cured adhesion promoter;

applying SPIE varnish to said cured adhesion promoter;

curing said SPIE varnish to form cured SPIE varnish;

applying a second layer of adhesion promoter to said cured varnish surface to form an adhesive surface;

curing said adhesive surface to form a cured adhesive surface; and laminating said polyimide dielectric material to said cured adhesive surface.

12. A method for adhering a film of polyimide dielectric to a substrate, said method comprising the steps of:

procuring a film of polyimide dielectric material;

procuring a generally planar substrate including exposed titanium-containing portions of said substrate;

etching said titanium-containing portions of said substrate with a HF etchant;

cleaning said etchant from said exposed titanium-containing portions of said substrate;

applying a first layer of adhesion promoter to said exposed titanium-containing portions of said substrate after said step of cleaning said etchant;

curing said first layer of adhesion promoter to thereby produce cured adhesion promoter;

applying SPIE varnish to said cured adhesion promoter;

curing said SPIE varnish to form cured SPIE varnish;

applying a second layer of adhesion promoter to said cured varnish surface to form an adhesive surface;

curing said adhesive surface to form a cured adhesive surface; and laminating said polyimide dielectric material to said cured adhesive surface.

13. A method for adhering a film of polyimide dielectric to a substrate, said method comprising the steps of:

procuring a film of polyimide dielectric material;

procuring a generally planar substrate including exposed copper-and-titanium-containing portions of said substrate;

etching said copper-and-titanium-containing portions of said substrate with an HF etchant;

following said etching with HF, etching said copper-and-titanium-containing portions of said substrate with cupric chloride etchant;

following said etching, cleaning said etchant from said exposed copper-and-titanium-containing portions of said substrate;

applying a first layer of adhesion promoter to said exposed copper-and-titanium-containing portions of said substrate after said step of cleaning said etchant;

curing said first layer of adhesion promoter to thereby produce cured adhesion promoter;

applying SPIE varnish to said cured adhesion promoter;

curing said SPIE varnish to form cured SPIE varnish;

applying a second layer of adhesion promoter to said cured varnish to form an adhesive surface;

curing said adhesive surface to form a cured adhesive surface; and laminating said polyimide dielectric material to said cured adhesive surface.

14. A method for adhering a film of polyimide dielectric to a substrate, said method comprising the steps of:

procuring a film of polyimide dielectric material;

procuring a generally planar substrate including exposed aluminum-containing portions of said substrate;

applying a first layer of adhesion promoter to said aluminum-containing portion of said substrate;

curing said first layer of adhesion promoter to thereby produce cured adhesion promoter;

applying SPIE varnish to said cured adhesion promoter;

curing said SPIE varnish to form cured SPIE varnish;

applying a second layer of adhesion promoter to said cured varnish to form an adhesive surface;

curing said adhesive surface to form a cured adhesive surface; and laminating said polyimide dielectric material to said cured adhesive surface.

* * * * *